United States Patent

Hiday et al.

[15] 3,679,990

[45] July 25, 1972

[54] VARIABLE FREQUENCY OSCILLATOR WITH SUBSTANTIALLY LINEAR AFC OVER TUNING RANGE

[72] Inventors: David R. Hiday, Ludlow; Ralph L. Mull, Jr., Fairview, both of Mass.

[73] Assignee: General Instrument Corporation, Newark, N.J.

[22] Filed: Jan. 27, 1971

[21] Appl. No.: 110,093

[52] U.S. Cl. ......................331/36 C, 331/117 R, 331/117 D, 331/177 V, 334/15

[51] Int. Cl. ......................................H03b 3/04, H03b 5/12

[58] Field of Search .............331/36 C, 117 R, 117 D, 177 V; 334/15

[56] References Cited

UNITED STATES PATENTS

| | | | |
|---|---|---|---|
| 3,210,678 | 10/1965 | Hallock | 331/36 C X |
| 3,219,944 | 11/1965 | Krausz et al. | 331/36 C |
| 3,353,126 | 11/1967 | Schucht | 331/36 C X |

*Primary Examiner*—John Kominski
*Assistant Examiner*—Siegfried H. Grimm
*Attorney*—James and Franklin

[57] ABSTRACT

A tuned transistor oscillator for use with an RF receiver includes a transistor amplifier having a tuned network coupled between the collector and base of the transistor. Feedback is provided by a capacitor coupled between the tuned network and the emitter of the transistor. The tuned network includes a transmission line, a variable capacitive reactance means in parallel therewith, a first variable capacitance diode in series with said reactance means, and a second variable capacitance diode serially connected to said line. The capacitance of said reactance means is varied to allow the oscillator to sweep the desired frequency range, and the first and second capacitance diodes are varied by a DC AFC (automatic frequency control) voltage provided by the discriminator of the RF receiver to prevent oscillator drift. Said first and second diode capacitances are arranged so that the first capacitance has its greatest effect at the lower end of the oscillator frequency range while the second capacitor has its greatest effect at the upper end of said range, thereby providing an AFC signal which varies the oscillator frequency by a substantially constant amount independently of the oscillator frequency.

16 Claims, 1 Drawing Figure

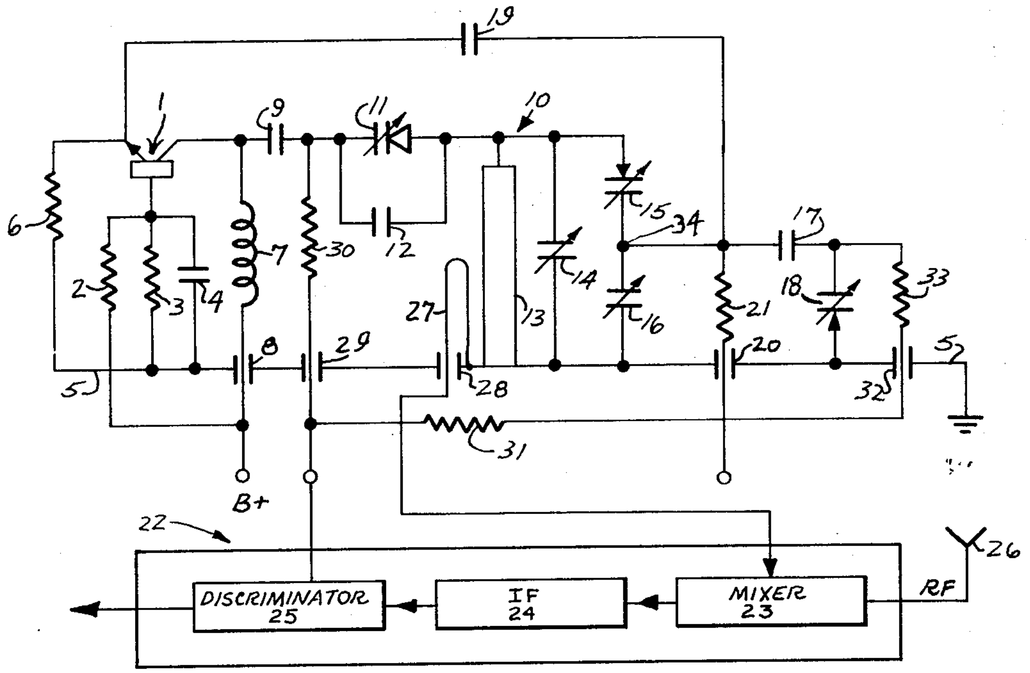
INVENTORS
DAVID R. HIDAY
RALPH L. MULL JR.
BY James and Franklin
ATTORNEY

VARIABLE FREQUENCY OSCILLATOR WITH SUBSTANTIALLY LINEAR AFC OVER TUNING RANGE

This invention relates to a variable frequency oscillator having AFC (automatic frequency control) and more particularly to such an oscillator wherein an AFC signal varies the oscillator frequency by a constant amount over the oscillator range.

Presently known oscillators having AFC, for example those utilized in UHF television tuners, are deficient in that the effect of the AFC signal on the resonant frequency of the oscillator is non-linear over the frequency range at which the oscillator is designed to operate. Thus, a variation in tuned network capacitance due to an AFC signal will have a different effect at the low frequency range, for example 500megacycles, than it will have at the upper end of the frequency range which may, for example, be 1,000 megacycles. This degrades the effectiveness of the oscillator since a given AFC voltage will cause a relatively substantial effect in oscillator frequency at one end of the range, but not at the other end, and, therefore, the AFC is not as effective as it might be.

Therefore, the main object of this invention is to provide a variable frequency oscillator having AFC wherein an AFC signal causes substantially equal variations in oscillator frequency throughout the oscillator frequency range.

It is a further object of this invention to provide such a variable frequency oscillator adaptable for use in a UHF television tuner, and particularly one in which the main tuning is achieved by a variable capacitance, such as a voltage-sensitive diode.

It is another object of the present invention to provide a circuit in which an AFC signal affects two different frequency-modifying circuit arrangements in an oscillator, one of those circuit arrangements having a predominant effect at one end of the oscillator frequency range and the other of those circuit arrangements having a predominating effect at the other end of the frequency range.

It is yet a further object of the present invention to have an electrical AFC signal act directly on electrical elements in an oscillator circuit in order to modify the reactance of those elements in such a fashion as to cause an AFC signal of given magnitude to have substantially uniform frequency-modifying effect throughout the frequency range of the oscillator.

To these ends an oscillator circuit is, as is conventional, provided with a tuned circuit portion which controls the frequency of the oscillation of the circuit. The tuned circuit portion comprises a first variable reactance which, when varied, causes the oscillator frequency to vary over its desired range. This is the conventional tuning element of the circuit. For AFC control two additional variable reactances are provided in the tuned circuit, one connected in that circuit so as to be effective primarily at one end of the oscillator frequency range and the other being connected in that circuit so as to be primarily effective at the other end of the tuning range. Hence the inherent sensitivity of these AFC-controlled instrumentalities to the particular frequency to which the oscillator may be tuned at any given moment is compensated for, and through a judicious weighting of the effect of each of those AFC-controlled instrumentalities an AFC signal of given magnitude will have substantially uniform effect in producing a change in frequency over the entire frequency range of the oscillator. In the form specifically disclosed, these instrumentalities comprise variable capacitance diodes, devices whose capacitance will vary depending upon the magnitude of the bias applied thereto, in this way permitting AFC control to be achieved directly from an electrical AFC signal. One of those diodes is connected in series with the main tuning reactance and the other is connected in parallel therewith, thereby to produce the desired frequency-varying effects at one end and the other of the oscillator frequency range. Each of those variable reactances is connected with another reactance, the latter functioning in combination with the former to determine the magnitude of the frequency-changing effect of the former. The variable capacitance diode connected in series with the main tuning reactance has its predominant effect at the high end of the oscillator frequency range, while the variable capacitance diode connected in parallel with the main tuning reactance has its predominant effect at the low end of the oscillator frequency range.

To the accomplishment of the above, and to such other objects as may hereinafter appear, the present invention relates to a variable frequency network, and to the use of such a network in an oscillator designed for AFC control, as defined in the appended claims and as described in this specification, taken together with the accompanying drawing, which is a circuit diagram of a preferred embodiment of the instant invention.

The drawing shows an oscillator having AFC adaptable for use in a UHF television tuner in the range, for example, of 500 megacycles to 1,000 megacycles. A transistor 1, in common base configuration, has a base biased, in a standard manner, by B+ and resistors 2 and 3. The transistor base is coupled, via capacitor 4, to ground 5, and the emitter of the transistor is coupled to ground 5 via resistor 6. The collector of the transistor is coupled to B+ via choke coil 7 and feed-through capacitor 8 in ground line 5, and the aforementioned circuit comprises an amplifier of a type well known in the prior art. A blocking capacitor 9 is connected between the collector termination of coil 7 and resonant network 10.

Variable resonant frequency network 10 is coupled to ground 5, and, through capacitor 9, to the transistor collector which operates as the amplifier output. The resonant frequency network includes a variable capacitance, here shown as a variable capacitance diode 11 in parallel with capacitor 12, the parallel combination connected in series with inductive transmission line 13, the other end of the inductive transmission line being coupled to ground 5. Variable capacitance diodes are known devices which act as capacitors the capacitance value of which varies with the reverse voltage bias applied thereto. Capacitor 14 is connected with transmission line 13, and main tuning reactance means 15, also shown in the form of a variable capacitance diode 15, and capacitor 16 in series therewith, are connected in parallel with capacitor 14. The junction point 34 of variable capacitance diode 15 and capacitor 16 is connected to capacitor 17 in series with another variable capacitance 18, also shown as a variable capacitance diode, said diode 18 being coupled between capacitor 17 and ground 5. A feedback capacitor 19 is connected between the junction point 34 and the emitter of transistor 1, the terminal 1*a* is connected to the emitter of the transistor operating as the input terminal of the transistor amplifier.

The preferred embodiment here illustrated involves the use of variable capacitance diodes 11, 18 to provide all-electronic control of the AFC effect, to permit the electrical AFC signal to be directly active on the variable reactances constituted by the variable capacitance diodes 11, 18. The main tuning element 15, effective to tune the oscillator over its desired frequency range, is also here shown as a variable capacitance diode so that the basic tuning effect also can be carried out in an all-electronic manner. However, it will be understood that other types of variable reactances could be used in place of the variable capacitance diodes here specifically shown.

Where the oscillator is to be utilized as part of a UHF television tuner, a DC tuning voltage, obtained in a manner well known in the art, is coupled via feed-through capacitor 20 and resistance 21 to voltage variable diode 15 to control the capacitance thereof. A utilization network 22, which is part of an RF receiver and contains a mixer stage 23, an IF stage 24 and a discriminator stage 25, receives an RF signal via antenna 26. The output signal of the oscillator is obtained via conductive loop 27 inductively coupled to transmission line 13 and transmitted via feed-through capacitor 28 and output terminal 27*a* to mixer 23 in utilization network 22. The frequency of the output signal of the mixer stage of concern here is equal to the difference between the oscillator frequency and the frequency of the received RF signal, and it is desired to maintain said mixer output signal at a selected frequency, for example, 40 megacycles. The mixer output signal is transmitted to IF stage 24 and from the IF stage to discriminator 25 which has, as one output signal, a DC voltage, the amplitude of which is related to variations in said mixer output signal from said selected frequency.

Thus, it will be seen that the DC output voltage from the discriminator may be used as an automatic frequency control (AFC) signal since when a particular RF signal is received, any variation in discriminator DC output voltage amplitude will be due to a variation in oscillator frequency and therefore the DC output voltage can be used to vary the frequency of the oscillator signal in such a manner as to maintain constant the frequency of the mixer output signal. The AFC signal is provided, via feed-through capacitor 29 and resistor 30, to variable capacitance diode 11 for varying the capacitance thereof. The AFC signal is also coupled, via resistor 31, feed-through capacitor 32 and resistor 33 to variable capacitance diode 18 for varying the capacitance of this last-mentioned diode.

The operation of the illustrated circuit as an oscillator is straightforward, will be readily understood by those skilled in the art and will therefore not here be explained in detail, except to state that the feedback capacitor 19 and the resonant character of network 10 cause the circuit to oscillate at a frequency determined by the network 10. It is the operation of the AFC portion of the circuit, and the manner in which it causes an AFC signal to provide the same oscillator frequency variation, regardless of the portion of the frequency range in which the oscillator is operating, which constitutes the present invention.

It will be clear that a variation in the capacitance of any one of the diodes 11, 15 and 18 will vary the resonant frequency of the tuned circuit 10 since the inductance of line 13 remains constant and the respective capacitances of the three diodes, connected in series and parallel with the transmission line, are the only three variable reactances in the circuit.

The capacitance of diode 15 is determined by the magnitude of the DC tuning voltage coupled thereto via resistor 21, the tuning voltage being provided in any known manner. As the capacitance of diode 15 varies, the resonant frequency of the tuned circuit varies through its entire range, which may extend from 500 to 1,000 megacycles. The capacitance of diode 15 is at its smallest value at the high end of the oscillator frequency range, and at its largest value at the lower end of the frequency range.

Turning now to the parallel combination of diode 11 and capacitor 12 which is in series with transmission line 13, it is seen that the total capacitance, due to the combination, in series with transmission line 13 is equal to $C_{11} + C_{12}$ where $C_{11}$ is the capacitance of diode 11 and $C_{12}$ is the capacitance of capacitor 12. It will further be seen that an incremental variation in $C_{11}$ will cause a percentage change in said series capacitance equal to $\Delta C_{11}/(C_{11}+C_{12}$. Therefore, the relative effect of a change in the capacitance of diode 11 will be greatest when the value of capacitor 12 is minimal, and will be smallest when the value of capacitor 12 is large compared to the capacitance diode 11. The magnitude of capacitor 12 therefore determines the percentage change in the capacitance value of the parallel combination for an incremental change in the capacitance of diode 11, and the value of capacitor 12 is selected to provide diode 11 with the desired degree of effectiveness. A variation in the capacitance of the parallel combination, $C_{11}+C_{12}$, in series with transmission line 13 will vary the capacitance of resonant network 10 by the same amount throughout the oscillator frequency range since the capacitance incorporated into the tuned network due to said parallel combination is independent of the operating frequency. Therefore, it follows that an AFC signal provided to diode 11 via resistor 30, varying the capacitance of the diode, in turn varies the resonant frequency of the tuned network by the same percentage throughout the frequency range of the oscillator. This means that the variation will be greatest at the high frequency end of the range and lowest at the low frequency end thereof. It therefore follows that an AFC signal applied to diode 11 has a much greater effect at high frequency than the same signal has if applied to diode 11 when the oscillator is tuned to a frequency at the lower end of its range.

Turning now to the combination of capacitors 16 and 17 and variable capacitance diode 18, the combination being in series with variable capacitance diode 15, it is seen that the total capacitance, termed $C_T$ due to the combination, in series with diode 15 is equal to $(C_{18})(C_{17})/(C_{18}+C_{17})+C_{16}$, where $C_{18}$ is the capacitance of diode 18; $C_{17}$ is the capacitance of capacitor 17; and $C_{16}$ is the capacitance of capacitor 16. Referring first to the series combination of capacitors 17 and 18, it is seen that when $C_{17}$ is large with respect to $C_{18}$ a variation in $C_{18}$ will have a great effect in the capacitance of the series combination, while when $C_{17}$ is small with respect to $C_{18}$, a variation in $C_{18}$ will have no effect on the capacitance of the combination. It therefore follows that when $C_{17}$ is small, $C_T$ is approximately equal to $C_{16}$ and any variation in the capacitance of diode 18 will have no effect, while if $C_{17}$ is large, the capacitance of the above-mentioned series combination will vary directly with the capacitance of diode 18 and $C_T$ will be equal to $C_{16}+C_{18}$. The value of capacitor 17 as was capacitor 12 with regard to diode 11, to give the desired degree of effectiveness to diode 18, and since the value of capacitor 16 is fixed, $C_T$ will vary directly with $C_{18}$. The AFC signal is coupled, via resistors 31 and 33 to diode 18 to thereby vary $C_{18}$, and to thus vary $C_T$. However, a variation in $C_T$ will not have a constant effect on the capacitance in parallel with transmission line 13 throughout the operating frequency range of the oscillator, since $C_T$ is in series with the capacitance of diode 15, and the capacitance of this series combination in parallel with line 13 is equal to $(C_{15} \times C_T/(C_{15}+C_T$. Thus, if $C_{15}$ is very large with respect to $C_T$, variations in $C_T$ have a direct effect on the capacitance in parallel with line 13, whereas if $C_{15}$ is small with respect to $C_T$, variations in $C_T$ have no effect on the capacitance in parallel with line 13. Since the capacitance of diode 15, $C_{15}$, is at its largest value at the lower end of the oscillator frequency range, it is seen that it is at this end of the range that $C_T$ has its greatest effect. At the upper end of the oscillator frequency range, $C_{15}$ is at its lowest value, and therefore variations in $C_T$ will have very little, if any, effect on the capacitance in parallel with line 13. It therefore follows that an AFC signal applied to diode 18 has a much greater effect at low frequencies than the same signal has if applied to diode 18 when the oscillator is tuned to a frequency at the upper end of its range.

Since the effect of diode 11 on the capacitance of tuned network 10 is great at the upper end of the oscillator frequency range and small at the lower end of the range, while the effect of diode 18 is great at the lower end of the oscillator frequency range and small at the upper end of the range, it may be seen that diode 18 has a relatively greater effect than diode 11 at the lower end of the frequency range and that diode 11 has a relatively greater effect than diode 18 at the upper end of the frequency range. Since diodes 11 and 18 have different degrees of effectiveness at different ends of the oscillator frequency range it will be clear that they may be chosen so that an AFC signal, which controls the capacitance of the diodes, has a substantially linear effect on the frequency of the oscillator throughout the range at which it is designed to operate.

As previously discussed, the values of capacitors 12 and 17 are chosen to control the effective ranges of diodes 11 and 18 respectively. The effect of choosing these values is that the capacitors thereby serve to maintain the substantially linear effect of the AFC signal throughout the oscillator frequency range.

Capacitors 14 and 16 are chosen to provide the desired oscillator frequency range. For example, when the smallest tuning voltage utilized is applied to diode 15 to minimize $C_{15}$, at the upper end of the frequency range, capacitor 14 is adjusted to insure that the oscillator can reach the upper limit of the desired range. In the same manner the value of capacitor 16 is selected so that when the tuning voltage is greatest, maximizing $C_{15}$, the oscillator can reach the lower limit of the desired oscillator operating range.

As will be seen from he above analysis, if one were to introduce into the main tuning circuit only a single variable reactance, corresponding either to the diode 11 or the diode 18, an AFC effect would result with variation in that reactance reactance, but a given AFC signal would produce different changes in frequency depending upon whether the oscillator circuit were tuned to a high frequency or to a low frequency. In accordance with the present invention, however, by providing a pair of such AFC-controlled variable reactances, one connected in the circuit so as to be primarily effective at the high frequency end of the oscillator frequency range and the other connected in the circuit so as to be primarily effective at the low frequency end of the oscillator frequency range, and by having both of these reactances affected by the AFC signal, the combined frequency-varying effect of those two reactances becomes substantially uniform over the entire frequency range of the oscillator. As a result a circuit is provided in which an AFC signal of given magnitude will have substantially the same frequency-changing effect no matter how the oscillator may be tuned at the time that the AFC signal becomes effective. Moreover, this may be accomplished in an all-electronic manner, without any moving parts, when those variable reactances are in the form of variable capacitance diodes. (It will be understood that, throughout this specification and the claims there, the term "variable capacitance diode" is used generically to comprehend all devices the capacitance of which will vary in accordance with an electrical bias applied thereto.)

While but a single embodiment of the present invention has been here specifically disclosed it will be apparent that many variations may be made therein, all within the scope of the present invention as defined in the following claims.

We claim:

1. A variable frequency oscillator having AFC comprising an amplifier having an input terminal and an output terminal; a variable tuned network coupled to said output terminal; and feedback means coupled between said tuned network and said input terminal; said tuned network comprising: first variable capacitive reactance means for varying the frequency of said oscillator over its range; second variable capacitive reactance means serially coupled to said first reactance means for varying the frequency of said oscillator at the lower portion of its range; inductance means connected in parallel combination with said first and second reactance means; and third variable capacitive reactance means serially coupled to said parallel combination for varying the frequency of said oscillator at the upper portion of its range.

2. The variable frequency oscillator of claim 1, in which said second and third variable capacitance reactance means are voltage-variable, means for producing a first control voltage, and means for applying said first control voltage to said second and third reactance means.

3. The variable frequency oscillator of claim 2, in which said first variable capacitive reactance means is voltage-variable, means for for producing a second control voltage, and means for applying said second control voltage to said first reactance means.

4. The variable frequency oscillator of claim 1, in which said first variable capacitive reactance means is voltage-variable, means for producing a control voltage, and means for applying said control voltage to said first reactance means.

5. A variable frequency oscillator, according to claim 2, wherein said second voltage variable capacitive reactance means comprises: first capacitance means, the magnitude of which is controlled by said first control voltage; a first capacitor serially connected to said first capacitance means; and a second capacitor connected in parallel with said first capacitance means and first capacitor.

6. A variable frequency oscillator, according to claim 5, wherein said third voltage variable capacitive reactance means comprises: second capacitance means, the magnitude of which is controlled by said first control voltage; and a third capacitor connected in parallel with said second capacitance means.

7. A variable frequency oscillator, according to claim 2, further comprising: a mixer circuit operatively connected to said output terminal of said oscillator; means for producing a second signal and for feeding it to said mixer circuit; and a discriminator circuit coupled to an output of said mixer circuit and having an output comprising said first control voltage.

8. The variable frequency oscillator of claim 7, in which said first variable capacitive reactance means is voltage-variable, means for producing a second control voltage, and means for applying said second control voltage to said first reactance means.

9. A variable frequency oscillator, according to claim 7, wherein said second voltage variable capacitive reactance means comprises: first capacitance means, the magnitude of which is controlled by said first control voltage; a first capacitor serially connected to said first capacitance means; and a second capacitor connected in parallel with said first capacitance means and first capacitor.

10. A variable frequency oscillator, according to claim 9, wherein said third voltage variable capacitive reactance means comprises: second capacitance means, the magnitude of which is controlled by said first control voltage; and a third capacitor connected in parallel with said second capacitance means.

11. A variable resonant frequency network comprising: first voltage variable capacitive reactance means controlled by a control voltage for varying said resonant frequency throughout a selected frequency range; second voltage variable capacitive reactance means controlled by another control voltage serially coupled to said first reactance means for varying said resonant frequency when said frequency is at the lower portion of its range; inductance means connected in parallel combination with said first and second reactance means; and third voltage variable capacitive reactance means controlled by said other control voltage serially coupled to said parallel combination for varying said frequency when it is at the upper portion of its range.

12. A variable resonant frequency network, according to claim 11, wherein said second voltage variable capacitive reactance means comprises: a first variable capacitance diode, the magnitude of capacitance of which is controlled by said other control voltage; a first capacitor serially connected to said first variable capacitance diode; and a second capacitor connected in parallel with said first variable capacitance diode and said first capacitor.

13. A variable resonant frequency network, according to claim 12, wherein said third voltage variable capacitive reactance means comprise: a second variable capacitance diode, the magnitude of capacitance of which is controlled by said other control voltage; and a third capacitor connected in parallel with said second variable capacitance diode.

14. Variable resonant frequency network comprising: first variable capacitive reactance means for varying said resonant frequency throughout a selected frequency range; second variable capacitive reactance means serially coupled to said first reactance means for varying said resonant frequency when said frequency is at the lower portion of its range; inductance means connected in parallel combination with said first and second reactance means; and third variable capacitive reactance means serially coupled to said parallel combination for varying said frequency when it is at the upper portion of its range.

15. A variable resonant frequency network, according to claim 14, wherein said second variable capacitive reactance means comprises: a first variable capacitance diode, the magnitude of capacitance of which is controlled by a control voltage; a first capacitor serially connected to said first variable capacitance diode; and a second capacitor connected in parallel with said first variable capacitance diode and said first capacitor.

16. A variable resonant frequency network, according to claim 15, wherein said third variable capacitive reactance means comprises: a second variable capacitance diode, the magnitude of capacitance of which is controlled by said control voltage; and a third capacitor connected in parallel with said second variable capacitance diode.

* * * * *